(12) United States Patent
Mukasa et al.

(10) Patent No.: US 6,639,218 B2
(45) Date of Patent: Oct. 28, 2003

(54) ELECTRON SPIN ANALYZER

(75) Inventors: Koichi Mukasa, Hokkaido (JP);
Masayuki Ikeda, Hokkaido (JP);
Kazuhisa Sueoka, Hokkaido (JP);
Masakazu Mutoh, Hokkaido (JP);
Hisao Kadono, Hokkaido (JP); Eisuke Ueda, Hokkaido (JP)

(73) Assignee: Hokkaido University, Sapporo (JP)

( * ) Notice: Subject to any disclaimer, the term of this patent is extended or adjusted under 35 U.S.C. 154(b) by 299 days.

(21) Appl. No.: 09/843,445

(22) Filed: Apr. 26, 2001

(65) Prior Publication Data

US 2002/0003213 A1 Jan. 10, 2002

(30) Foreign Application Priority Data

May 2, 2000 (JP) ........................................ 2000-133700

(51) Int. Cl.$^7$ ........................... H01J 37/252; H01J 37/20
(52) U.S. Cl. ..................... 250/310; 250/305; 250/398; 250/440.11; 313/363.1
(58) Field of Search ................................ 250/310, 305, 250/398, 440.11; 313/363.1

(56) References Cited

U.S. PATENT DOCUMENTS

| 4,153,844 A | * | 5/1979 | Kirschner | 324/71.3 |
| 4,658,138 A |   | 4/1987 | Koike et al. | 250/310 |
| 4,760,254 A | * | 7/1988 | Pierce et al. | 250/305 |
| 4,954,770 A | * | 9/1990 | Matsuyama et al. | 324/71.3 |
| 5,166,522 A |   | 11/1992 | Koike et al. | 250/310 |
| 5,444,243 A | * | 8/1995 | Kohhashi et al. | 250/305 |
| 2002/0003212 A1 | | 1/2002 | Mukasa et al. | 250/310 |
| 2002/0132169 A1 | * | 9/2002 | Yamamoto et al. | 429/317 |

FOREIGN PATENT DOCUMENTS

| JP | 60017846 A | 1/1985 |
| JP | 60105152 A | 6/1985 |
| JP | 63284690 A | 11/1988 |
| JP | 10020044 A | 1/1998 |

* cited by examiner

*Primary Examiner*—Nikita Wells
(74) *Attorney, Agent, or Firm*—Knobbe Martens Olson & Bear, LLP

(57) ABSTRACT

A hemisphere accelerating electrode has a double structure composed of an inner accelerating electrode and an outer accelerating electrode. The inner accelerating electrode has an inner introducing inlet and an inner opening, and the outer accelerating electrode has an outer introducing inlet and an outer opening. The aperture angle of the inner introducing inlet is preferably larger than that of the outer introducing inlet by 0.1–5 degrees. Then, the aperture angle of the inner opening is preferably larger than that of the outer opening by 0.1–5 degrees. Moreover, scattered electron detectors have correcting electrodes, respectively, and are arranged in the shifted directions from the introducing direction of electrons by 100–140 degrees.

15 Claims, 3 Drawing Sheets

ELECTRON SPIN ANALYZER

BACKGROUND OF THE INVENTION

1. Field of the Invention

This invention relates to an electron spin analyzer, particularly, to an electron spin analyzer which is preferably usable for a high effective electron spin analyzer such as an electronic material analyzer and a magnetic material surface analyzer.

2. Description of the Prior Art

A conventional electron spin analyzer tends to be enlarged for detecting scattered electrons effectively. For example, a Mott spin analyzer is required to detect scattered electrons over the wide scattered angle range of 95–145 degrees, and thus, the scattered electron detector thereof must be enlarged.

An enlargement of an apparatus is not desired in view of installment space and operationality, and thus, the electron spin analyzer is also being required to be downsized. However, if the conventional electron spin analyzer is downsized with maintaining the structure, it can detect the scattered electrons effectively.

SUMMARY OF THE INVENTION

It is an object of the present invention to provide an electron spin analyzer which can detect scattered electrons even if it is downsized.

For achieving the above object, this invention relates to a first electron spin analyzer comprising an electron beam-generating apparatus, a hemisphere accelerating electrode opposing to the electron beam-discharging hole of the electron beam-generating apparatus, an electrode supporter to support the accelerating electrode, a scattered electron detector provided on the outer surface of the accelerating electrode, and a scattering target provided on the electrode supporter inside the accelerating electrode, the accelerating electrode having a double structure composed of an inner accelerating electrode with an inner introducing inlet and an outer accelerating electrode with an outer introducing inlet, the inner introducing inlet being larger than the outer introducing inlet.

Moreover, this invention relates to a second electron spin analyzer comprising an electron beam-generating apparatus, a hemisphere accelerating electrode opposing to the electron beam-discharging hole of the electron beam-generating apparatus, an electrode supporter to support the accelerating electrode, a scattered electron detector provided on the outer surface of the accelerating electrode, and a scattering target provided on the electrode supporter inside the accelerating electrode, the accelerating electrode having a double structure composed of an inner accelerating electrode with an inner opening to introduce scattered electrons from the scattering target into the scattered electron detector and an outer accelerating electrode with an outer opening to do ditto, the inner opening being larger than the outer opening.

Furthermore, this invention relates to a third electron spin analyzer comprising an electron beam-generating apparatus, a hemisphere accelerating electrode opposing to the electron beam-discharging hole of the electron beam-generating apparatus, an electrode supporter to support the accelerating electrode, a scattered electron detector having a correcting electrode therein provided on the outer surface of the accelerating electrode, and a scattering target provided on the electrode supporter inside the accelerating electrode.

And then, this invention relates to a fourth electron spin analyzer comprising an electron beam-generating apparatus, a hemisphere accelerating electrode opposing to the electron beam-discharging hole of the electron beam-generating apparatus, an electrode supporter to support the accelerating electrode, a scattered electron detector provided on the outer surface of the accelerating electrode, and a scattering target provided on the electrode supporter inside the accelerating electrode, the scattered electron detector being arranged in the shifted direction from an introducing direction of electrons to be introduced by 100–140 degrees.

The inventors has intensely studied to prevent the degradation of the detection sensitivity of scattered electrons even if the electron spin analyzer is downsized. At last, they found the following fact: That is, the electron spin analyzer is so formed that its hemisphere accelerating electrode is composed of an inner accelerating electrode and an outer accelerating electrode, and its inner introducing inlet formed at the inner accelerating electrode has a larger size than that of its outer introducing inlet formed at the outer accelerating electrode, according to the first electron spin analyzer of the present invention. As a result, electron beams to be introduced can be converged onto a scattering target in high density, and thus, the convergence degree of the scattered electrons is increased.

According to the first electron spin analyzer of the present invention, the scattered electrons can be detected effectively, and the detection sensitivity can be increased.

Moreover, according to the second electron spin analyzer of the present invention, the inner opening formed at the inner accelerating electrode to introduce the scattered electrons into a scattered electron detector is larger than the outer opening formed at the outer accelerating electrode to do ditto. Therefore, the convergence degree of the scattered electrons is increased, so that the scattered electrons can be detected effectively at the scattered electron detector and the detection sensitivity of the analyzer can be increased.

Furthermore, according to the third electron spin analyzer of the present invention, since a correcting electrode to capture the scattered electrons for the scattered electron detector is provided, the convergence degree of the scattered electrons can be increased. Therefore, the detection sensitivity of the analyzer can be increased.

Then, the inventors have also figured out that, although the distribution of scattered electrons becomes maximum in the shifted direction from the introducing direction of the electron by 120 degrees in a normal size electron spin analyzer, it becomes maximum in the different direction from the shifted direction in a downsized electron spin analyzer. Since the fourth electron spin analyzer of the present invention is so fabricated that the scattered electron detector is positioned at the maximum distribution of the scattered electrons, the detection sensitivity of the scattered electrons can be increased.

The first through the fourth electron spin analyzers may be independently employed, respectively, but some of the analyzers may be combined in their respective characteristics. If all the analyzers are combined in their respective characteristics, the detection sensitivity of the scattered electrons can be extremely increased.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to figures.

Figure 1:
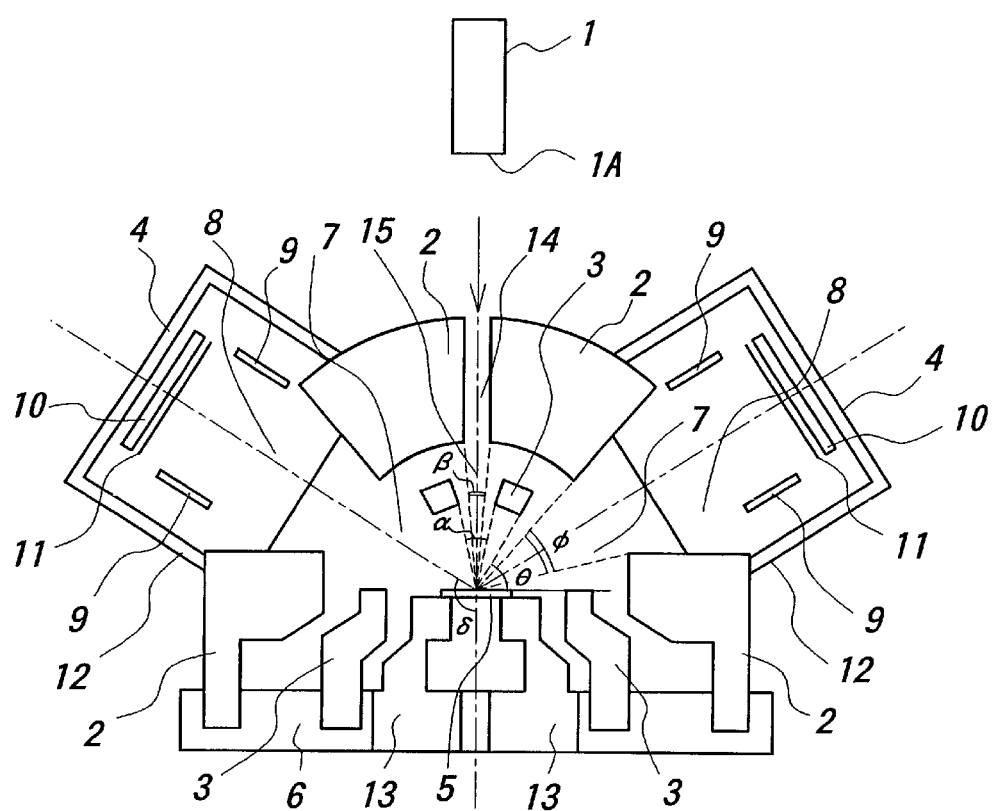
FIG. 1 is a cross sectional view showing an embodiment in the electron spin analyzer of the present invention.

FIG. 1 is a cross sectional view showing a preferred embodiment in the electron spin analyzer of the present invention in which the first through the fourth electron spin analyzers are combined in their respective characteristics. Herein, the introducing direction of electrons is designated by an arrow.

An electron spin analyzer depicted in FIG. 1 has an electron beam-generating apparatus 1, a hemisphere accelerating electrode composed of an outer accelerating electrode 2 and an inner accelerating electrode 3 which are positioned so as to oppose the electron beam-discharging hole 1A of the electron beam-generating apparatus 1. The outer and inner accelerating electrodes 2 and 3 are supported by an electrode supporting member 6. A pair of scattered electron detectors 4, 4 are provided on the outer surface of the outer accelerating electrode 2 so as to be symmetrical for the introducing direction of electrons, and a scattering target 5, supported by a supporter 13 attached to the electrode supporting member 6, is provided inside the outer and inner accelerating electrodes 2 and 3.

An outer introducing inlet 14 and an inner introducing inlet 15 are formed at the outer accelerating electrode 2 and the inner accelerating electrode 3, respectively, for introducing electron beams from the electron beam-generating apparatus 1 onto the scattering target 5. Then, outer openings 8, 8 and inner openings 7, 7 are formed at the outer accelerating electrode 2 and the inner accelerating electrode 3, respectively, for introducing the scattered electrons from the scattering target 5 into the scattered electron detectors 4, 4.

According to the present invention, it is required that the inner introducing inlet 15 have a larger size than that of the outer introducing inlet 14. Concretely, it is preferable that the aperture angle α of the inner introducing inlet 15 is larger than the aperture angle β of the outer introducing inlet 14 by 0.1–5 degrees. Thereby, as mentioned above, the introduced electrons can be converged onto the scattering target in high density, and thus, the detection sensitivity of the scattered electrons can be increased.

Moreover, according to the present invention, it is required that each of the inner openings 7, 7 has a larger size than that of each of the outer openings 8, 8. Concretely, it is preferable that the aperture angle θ of the inner opening 7 is larger than the aperture angle φ of the outer opening 8 by 1.0–5 degrees. Thereby, as mentioned above, the scattered electrons can be converged in high density, and thus, the detection sensitivity of the scattered electrons can be increased through the increase of the detection degree of the scattered electrons at the scattered electron detectors.

Figure 2:
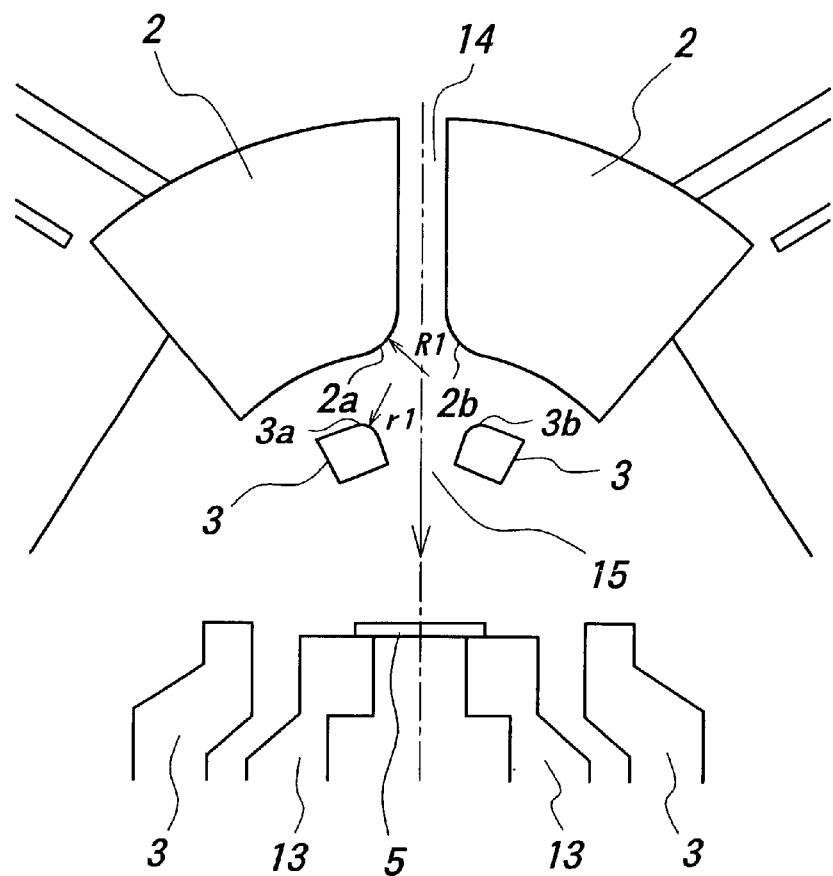
FIG. 2 is an enlarged sectional view showing a part of the electron spin analyzer shown in FIG. 1.

FIG. 2 is an enlarged view showing a part of the electron spin analyzer shown in FIG. 1 near the outer introducing inlet 14 and the inner introducing inlet 15.

As is apparent from FIG. 2, the edge portions 2a, 2b and 3a, 3b, which are opposed one another, of the outer and inner introducing inlets 14 and 15 formed at the outer and inner accelerating electrodes 2 and 3 have curvatures, respectively. Therefore, the convergence degree of the introduced electrons can be much increased, and thus, the detection sensitivity of the scattered electrons can be much increased.

On account of the same reason, it is desired that each of the edge portions 2a and 2b of the outer introducing inlet 14, formed at the outer accelerating electrode 2, has a curvature radius R1 of 0.5–2 mm.

Similarly, it is desired that each of the edge portions 3a and 3b of the inner introducing inlet 15, formed at the inner accelerating electrode 3, has a curvature radius r1 of 0.5–2 mm.

Figure 3:
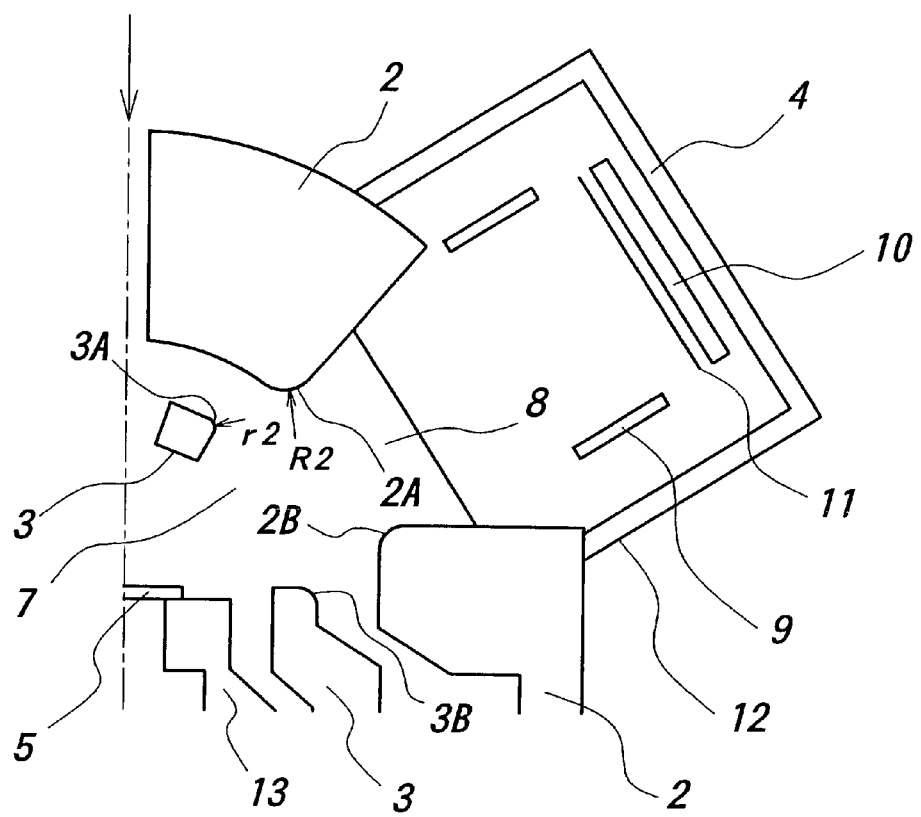
FIG. 3 is also an enlarged sectional view showing a part of the electron spin analyzer shown in FIG. 1.

FIG. 3 is an enlarged view showing a part of the electron spin analyzer shown in FIG. 1 near the inner opening 7 and the outer opening 8.

As is apparent from FIG. 3, the edge portions 2A, 2B and 3A, 3B, which are opposed one another, of the outer and inner openings 8 and 7 formed at the outer and inner accelerating electrodes 2 and 3 have curvatures, respectively. Therefore, the convergence degree of the introduced electrons can be much increased, and thus, the detection sensitivity of the scattered electrons can be much increased.

On account of the same reason, it is desired that each of the edge portions 2A and 2B of the outer opening 8, formed at the outer accelerating electrode 2, has a curvature radius R2 of 0.5–2 mm.

Similarly, it is desired that the edge portions 3A and 3B of the inner opening 7, formed at the inner accelerating electrode 3, has a curvature radius r2 of 0.5–2 mm.

The scattered electron detector 4 has a detector 10, a grid 11 in front of the detector 10, and a correcting electrode 9 in both sides of the detector 10 and the grid 11, which are enclosed by a shield 12. The scattered electrons to be introduced into the scattered electron detectors 4, 4 are converged by the correcting electrode 9 provided in the detector 8, and thus, the large amount of the scattered electrons can arrive at the detector 10 through the grid 11. As a result, the electron spin analyzer depicted in FIG. 1 can have high sensitivity.

Since the correcting electrode 9 is provided for converging the scattered electrons to be introduced into the scattered electron detector 4, it is preferably composed of an electrostatic lens. As the electrostatic lens, a unipotential lens and a bipotential lens may be exemplified. Moreover, it is desired that the electrostatic lens has a cylindrical shape for enhancing the convergence degree of the scattered electrons.

The scattered electron detectors 4, 4 are positioned in the shifted directions from the introducing direction of electrons by an angle δ of 100–140 degrees except 120 degrees, preferably 115–125 degrees except 120 degrees. As mentioned above, since the distribution of the scattered electrons becomes maximum at the above positions when the electron spin analyzer is downsized, the detection sensitivity of the scattered electrons can be enhanced if the scattered electron detectors are arranged at the above positions.

Herein, each part constituting the electron spin analyzer depicted in FIG. 1 may be made of a well known material to persons skilled in the art.

Moreover, the electron spin analyzer shown in FIG. 1 has the above-mentioned pair of scattering electron detectors which are symmetrical for the introducing direction of electrons. Therefore, spin component in one direction from among the scattered electrons can be measured. Furthermore, not shown in FIG. 1, if an additional pair of scattered electron detectors are arranged in the direction perpendicular to this paper so that each of all the four scattered electron detectors can satisfy four-fold symmetric condition, spin components in two directions from among the scattered electrons can be measured.

Although the present invention was described in detail with reference to the above example, this invention is not limited to the above disclosure and every kind of variation and modification may be made without departing from the scope of the present invention.

As explained above, according to the present invention, the electron spin detector can be downsized without the degradation of the detection sensitivity of the scattered electrons.

What is claimed is:

1. An electron spin analyzer comprising:
   an electron beam-generating apparatus having an electron beam exit aperture,
   a hemisphere accelerating electrode provided opposite to the electron beam exit aperture of the electron beam-generating apparatus,
   an electrode supporter to support the accelerating electrode,
   a scattered electron detector provided on an outer surface of the accelerating electrode, and
   a scattering target provided on the electrode supporter inside the accelerating electrode,
   wherein the accelerating electrode has a double structure composed of an inner accelerating electrode with an electron beam inlet and an outer accelerating electrode with an electron beam inlet, the electron beam inlet of the inner accelerating electrode being set larger than the electron beam inlet of the outer accelerating electrode.

2. The electron spin analyzer as defined in claim 1, wherein an aperture angle of the electron beam inlet of the inner accelerating electrode is set larger than an aperture angle of the electron beam inlet of the outer accelerating electrode by 0.1–5 degrees.

3. The electron spin analyzer as defined in claim 1 or 2, wherein edge portions of the electron beam inlets of the inner accelerating electrode and the outer accelerating electrode are formed in curvature.

4. An electron spin analyzer comprising;
   an electron beam-generating apparatus having an electron beam exit aperture,
   a hemisphere accelerating electrode provided opposite to electron beam exit aperture of the electron beam-generating apparatus,
   an electrode supporter to support the accelerating electrode,
   a scattered electron detector provided on an outer surface of the accelerating electrode, and
   a scattering target provided on the electrode supporter inside the accelerating electrode,
   wherein the accelerating electrode has a double structure composed of an inner accelerating electrode with an electron beam outlet to introduce scattered electrons from the scattering target into the scattered electron detector and an outer accelerating electrode with an electron beam outlet to introduce scattered electrons from the scattering target into the scattered electron detector, the electron beam outlet of the inner accelerating electrode being set larger tan the electron beam outlet of the inner accelerating electrode.

5. The electron spin analyzer as defined in claim 4, wherein an aperture angle of the electron beam outlet of the inner accelerating electrode is set larger than an aperture angle of the electron beam outlet of the outer accelerating electrode by 0.1–5 degrees.

6. The electron spin analyzer as defined in claim 4 or 5, wherein edge portions of the electron beam outlets of the inner accelerating electrode and the outer accelerating electrode are formed in curvature.

7. An electron spin analyzer comprising:
   an electron beam-generating apparatus having an electron beam exit aperture,
   a hemisphere accelerating electrode provided opposite to the electron beam exit aperture of the electron beam-generating apparatus,
   an electrode supporter to support the accelerating electrode,
   a scattered electron detector having a correcting electrode therein and provided on an outer surface of the accelerating electrode, and
   a scattering target provided on the electrode supporter inside the accelerating electrode.

8. The electron spin analyzer as defined in claim 7, wherein the correcting electrode is composed of an electrostatic lens.

9. An electron spin analyzer comprising:
   an electron beam-generating apparatus having an electron beam exit aperture,
   a hemisphere accelerating electrode provided opposite to the electron beam exit aperture of the electron beam-generating apparatus,
   an electrode supporter to support the accelerating electrode,
   a scattered electron detector provided on an outer surface of the accelerating electrode, and
   a scattering target provided on the electrode supporter inside the accelerating electrode,
   wherein the scattered electron detector is arranged in a direction shifted from an introducing direction of electrons to be detected by 100–140 degrees.

10. An electron spin analyzer comprising:
    an electron beam-generating apparatus having an electron beam exit aperture,
    a hemisphere accelerating electrode provided opposite to the electron beam exit aperture of the electron beam-generating apparatus,
    an electrode supporter to support the accelerating electrode,
    a scattered electron detector having a correcting electrode therein and provided on an outer surface of the accelerating electrode, and
    a scattering target provided on the electrode supporter inside the accelerating electrode,
    wherein the accelerating electrode has a double structure composed of an inner accelerating electrode having an electron beam inlet and an electron beam outlet to introduce scattered electrons from the scattering target into the scattered electron detector and an outer accelerating electrode having an electron beam inlet and an electron beam outlet to introduce scattered electrons from the scattering target into the scattered electron detector, the electron beam inlet of the inner accelerating electrode being set larger than the electron beam inlet of the outer accelerating electrode, the electron beam outlet of the inner accelerating electrode being set larger than the electron beam outlet of the outer accelerating electrode, andthe scattered electron detector is ranged in a direction shifted from an introducing direction of electrons to be introduced by 100–140 degrees.

11. The electron spin analyzer as defined in claim 10, wherein an aperture angle of the electron beam inlet of the inner accelerating electrode is set larger than an aperture angle of the electron beam inlet of the outer accelerating electrode by 0.1–5 degrees.

12. The electron spin analyzer as defined in claim 10 or 11, wherein edge portions of the electron beam inlets of the inner accelerating electrode and the outer accelerating electrode are formed in curvature.

13. The electron spin analyzer as defined in claim 10, wherein an aperture angle of the electron beam outlet of the inner accelerating electrode is set larger tan an aperture angle of the electron beam outlet of the outer accelerating electrode by 0.1–5 degrees.

14. The electron spin analyzer as defined in claim 10 or 13, wherein edge portions of the electron beam outlets of the inner accelerating electrode and the outer accelerating electrode are formed in curvature.

15. The electron spin analyzer as defined in claim 10, 11 or 13, wherein the correcting electrode is composed of an electrostatic lens.

* * * * *